US006462348B1

(12) United States Patent
Gelbart

(10) Patent No.: US 6,462,348 B1
(45) Date of Patent: Oct. 8, 2002

(54) PLURAL FOILS SHAPING INTENSITY PROFILE OF ION BEAMS

(75) Inventor: William Z. Gelbart, Garden Bay (CA)

(73) Assignees: The University of Alberta, Simon Fraser University, Vancouver (CA); The University of Victoria, The University of British Columbia, Vancouver (CA); Carleton University, Vancouver (CA)

( * ) Notice: Subject to any disclaimer, the term of this patent is extended or adjusted under 35 U.S.C. 154(b) by 0 days.

(21) Appl. No.: 09/707,950

(22) Filed: Nov. 8, 2000

Related U.S. Application Data

(60) Provisional application No. 60/164,136, filed on Nov. 8, 1999.

(51) Int. Cl.[7] .................................................. H01J 37/00
(52) U.S. Cl. ..................................................... 250/505.1
(58) Field of Search ......................... 250/492.21, 492.1, 250/492.22, 492.3, 492.2, 505.1, 281, 282

(56) References Cited

U.S. PATENT DOCUMENTS

| | | | | |
|---|---|---|---|---|
| 3,469,094 A | * | 9/1969 | Erickson | 250/41.9 |
| 3,896,392 A | | 7/1975 | Hudson et al. | |
| 4,283,632 A | * | 8/1981 | Nakagawa et al. | 250/503 |
| 5,073,913 A | | 12/1991 | Martin | |
| 5,440,133 A | * | 8/1995 | Moyers et al. | 250/492.3 |

FOREIGN PATENT DOCUMENTS

| | | |
|---|---|---|
| DE | 3013932 | 10/1981 |

OTHER PUBLICATIONS

Database Inspec/IEE, "Characteristics of INER TR30/15 H/sup –//D/supCompact Cyclotron", Database accession No. 4780617 XP002166700 Abstract.

"An H/sup–//Light Ion Synchrotron for Radiation Therapy", Nuclear Instruments & Methods In Physics Research, Section A, Arduini, G., et al., pp. 542–552.

"A Second Stripper For An En Or FN Tandem Accelerator", Nuclear Instruments and Methods in Physics Research, K.R. Chapman, Jan. 15, 1983, Netherlands, vol. 205, No. 1–2, pp. 69–72.

"Cyclotrons And Their Applications", Proceedings of the 13$^{th}$ International Conference, Vancouver, 1992. G. Dutto et al., World Scientific, pp. 110–114.

"Encapsulated Target For Isotope Production Cyclotrons" Shervin Bakhtiari et al., 1998 IEEE, pp. 3842–3844.

"Investigation of the Thermal Performance of Solid Targets for Radioisotope Production", F.M. Nortier et al., Nuclear Instruments & Methods InPhysics Research, (1995), pp. 236–241.

"Investigation of the Thermal Performance of Solid Targets for Radioisotope Production", F.M. Nortier, et al., Triumf, Vancouver, B.C., Canada V6T 2A3.

"Proceedings of the IVth International Workshop on Targetry and Target Chemistry" PSI Villigen, Switzerland, Sep. 9–12, 1991, edited by Regin Weinreich, pp. 52–53.

"A High–Power Target System For Radioisotope Production", J.J. Burgerjon et al., Triumf, Vancouver, B.C. Canada V6T 2A3, Pro. 11$^{th}$ Int. Conf. on Cyclotrons and their Applications (Ionics, Tokyo, 1987), pp. 634–637.

(List continued on next page.)

*Primary Examiner*—Kiet T. Nguyen

(57) ABSTRACT

The invention presents an approach that uses plural separated foils to shape an ion beam so that the intensity density of hot spots in the ion beam is lowered. More particularly, plural foils are placed in close proximity to each other, wherein at least one foil intercepts a portion of the beam to strip a charge from ions in different portions of the beam at different times, and thus, shape the ion beam. At a basic level, the inventive approach places plural foils so that the distance between planes of successive foils is a fraction of the radius of curvature of the beam's cyclotron orbit.

31 Claims, 10 Drawing Sheets

OTHER PUBLICATIONS

"Investigation of Thermal–Mechanical Properties of Solid Targets For Radioisotopes Production", Ray Wong et al., Triumf, Vancouver B.C., Canada V6T 2A3, pp. 1–3.

"High Current Radioisotope Production with Solid Target System", W.Z. Gelbart et al., reprinted from IEEE, Proceedings of the 1993 Particle Acceleration Conference, pp. 3099–3101.

* cited by examiner

PLURAL FOILS SHAPING INTENSITY PROFILE OF ION BEAMS

CROSS REFERENCE TO RELATED APPLICATION

This application claims priority under 35 U.S.C. §119 (e) of U.S. Provisional application 60/164,136, filed Nov. $8^{th}$, 1999, the entire contents of which are incorporated herein by reference.

FIELD OF THE INVENTION

The present invention relates to a technique for using foils to shape ion beams.

BACKGROUND OF THE INVENTION

Ion beams have many important uses in scientific research, medicine, and industrial applications. The uses include, but are not limited to, research in fundamental particle physics, research in nuclear physics and chemical, isotope generation, medical research and treatment, imaging, writing on hard materials, cutting, etc. Generating, shaping and directing ion beams requires equipment including ion generators, magnetic field generators, and magnetic field lenses, as well as complex circuitry to control their performance. Such equipment is complex and expensive.

Ion beams by their very nature, are composed of charged particles. The charging of the particles is necessary to enable the acceleration of the particles forming the beam. Directing charged particle beams requires complex and expensive equipment because the charged particles tend to repel each other. Therefore, controlling an ion beam requires further complex and expensive equipment.

Ion beam generators, generally, have a main beam that is directed onto a target. Van De Graff tandem generators are typically used to generate low energy ion beams. Cyclotron accelerators are typically used to generate high-energy ion beams.

In applications using ion beams, one typically desires to maintain the integrity of the irradiated target—unless, of course, an application specifically is designed to destroy or change the irradiated target. Economic and efficiency considerations require that one attempt to use as much of the power of an ion beam as possible. Ideally, one would prefer to direct all of the power in a generated ion beam onto a target. The intensity profiles of ion beams, however, have high intensity regions (hot spots). For example, the cross section of an actual ion beam is well approximated by the Gaussian distribution, with an intensity peak at the center. The temperature distribution on a target is determined by the intensity distribution of the incident power: regions in a target exposed to higher power intensity have higher temperatures. Hot spots, therefore, act as seeds for starting the thermal damage of targets and, thus, limit the efficiency of using the total power available in the ion beam.

Moreover, not all target materials are in solid form. For example, many applications require, or use, targets having gaseous or liquid form. Such targets require container—usually a thin foil—to contain the target material. However, container walls absorb some of the ion beam irradiated onto the target and, thus, also heat up. Non-uniform intensity profiles of irradiated ion beams, therefore, cause loss of target material containment by rupturing container walls (due to thermal damage) at points exposed to the hot spots of the incident ion beam.

Furthermore, a new generation of cyclotrons have increasing power capability, which make them even more useful in isotope generation. However, as explained above, targets lag behind in their ability to handle the higher power of ion beams generated by the new cyclotron resonators. Optimizing the design of targets, using new alloys as target substrates, and enhancing cooling efficiency would allow targets to handle ion beams having higher powers. Such improvements, however, are reaching the limits of their possible refinements.

In addition to thermal damage, hot spots lead to non-uniform products. For example, many applications require special materials composed from isotopes that are generated by irradiating ion beams onto a parent target. Therefore, ion beams having hot spots lead to the non-uniform distribution of isotopes within the target material and therefore lower the yield of isotope generation and parent material utilization.

To increase the efficiency of using the power available in an ion beam, therefore, users must reshape the intensity profile of the ion beam by removing ions from hot spots to lower intensity regions within the cross section of the ion beam. Ideally, it is desirable that an ion beam be obtained that has a top-hat intensity profile so that all of the power can be used—a desire that is practically impossible to satisfy.

One way to reduce the intensity of hot spots in a beam is to defocus the beam and trim it to the target shape. The defocusing reduces the peak energy deposited onto the target by shifting it to the wings and, thus, reduces the highest temperature of the target surface. However, such trimming wastes portions of the generated energy beam and further increases the ambient radiation levels during operation. This is an inefficient and unsafe result. In normal practice, only about 10% to 20% of the beam is typically trimmed.

Another way to reduce the peak intensity is to use sophisticated multiple-pole magnetic lenses (e.g., specially designed new configurations for sexapole magnetic lenses) to reshape and flatten the beam cross section. The drawback in implementing such an approach is the design and manufacturing cost of such complex magnetic lenses combined with their relative invariant nature and extra floor space needed regarding placement. Currently, such approaches, therefore, have limited practical use.

Similar arguments restrict the use of rotating or swept beams. In addition, such sweeping beams still have high intensity density and, therefore, cause instantaneous stresses in an irradaited target. The thermal cycling of these stresses lead to the premature failure of the irradiated target as a result of metal fatigue. Thus, a need exists for a way to increase the use of available power in an ion beam.

SUMMARY OF THE INVENTION

The invention presents an approach that uses plural separated foils to shape an ion beam so that the intensity density of hot spots in the ion beam can be lowered. More particularly, plural foils are placed in close proximity to each other, wherein at least one foil intercepts a portion of the beam to strip electrical charge from ions in different portions of the beam at different times and, thus, shape the ion beam. At a basic level, the inventive approach places plural foils so that the distance between planes of successive foils is preferably a small fraction of the radius of curvature of the beam's cyclotron orbit.

The inventive approach has an advantage of using low cost implements, of a very simple and controllable nature, to shape the intensity density of ion beams generated by existing accelerators and enhance their utility. Moreover, it shapes the intensity within an ion beam without sacrificing energy from the ion beam. The inventive approach, in a simple and inexpensive manner, can be used to divide a single ion beam into plural ion beams that are nearly parallel and that have a controllable separation. As such, a single ion beam can be divided into plural beams so that the highest intensity density on an irradiated target can be lowered, with the total energy deposition onto a target not being reduced.

BRIEF DESCRIPTION OF THE DRAWINGS

Other aspects and advantages of the present invention will become apparent upon reading the detailed description and accompanying drawings given hereinbelow, which are given by way of illustration only, and which are thus not limitative of the present invention, wherein:

FIG. 1 (*b*) is a depiction of the intensity profile for a dual beam;

FIG. 2(*b*) is a modeling of the thermal distribution on a target irradiated by the ion beam of FIG. 1(*b*);

FIG. 3(*b*) depicts a top-hat like beam intensity profile on a target, generated by the first embodiment;

FIG. 3(*c*) depicts a beam profile on a target, generated by repositioning the foils in the first embodiment;

FIG. 5(*b*) depicts a top-hat like beam intensity profile on a target, generated by the third embodiment;

FIG. 5(*c*) depicts a top-hat like beam intensity profile on a target, generated by the third embodiment using a tilted middle foil;

FIG. 6(*b*) depicts a top-hat like beam intensity profile on a target, generated by the fourth embodiment.

DETAILED DESCRIPTION OF THE PREFERRED EMBODIMENTS

The invention presents an approach that uses plural separated foils to shape an ion beam so that the intensity density of hot spots in the ion beam can be lowered. More particularly, plural foils are placed in close proximity to each other, wherein at least one foil intercepts a portion of the beam to strip electrical charge from ions in different portions of the beam at different times and, thus, shape the ion beam. At a basic level, the inventive approach places plural foils so that the distance between planes of successive foils is preferably a small fraction of the radius of curvature of the beam's cyclotron orbit.

An exemplary embodiment of the invention utilizes two foils placed in proximity to each other, to strip electrons from negative ions in different portions of a generated negative ion beam (e.g., an ion beam comprising $H^-$ ions) at different times and, thus, shape the ion beam. The ion beam can be generated by any number of sources including, but not limited to, Van De Graff tandem generators, cyclotron accelerators, etc. The present invention is not limited to any specific ion beam generator.

At least one of the foils intercepts a portion of the beam. The distance, along a beam's orbital path, between the planes of the successive foils is preferably a small fraction of the radius of curvature of the beam's cyclotron orbit. The term "small fraction" is used to mean not greater than 10%; in most applications, the orbital distance between successive foils is equal to, or less than, 10 millimeters (mm) and in many applications the orbital distance is equal to or less than 2 mm. The foils are arranged so that they have a large number of free, or nearly free, electrons. For example, the foils can be implemented as thin graphite strips that are electrically grounded. A foil strips electrons from negative ions that go through it. Thus, in this example, the $H^-$ ions would become $H^+$.

The generated negative ion beam meets a first foil that strips the electrons from a first half of the beam's cross section. The charge-stripped ions in this half of the beam flip their orbit, are thus extracted from the ion beam, and are directed towards a target. The remaining portion of the negative ion beam meets a second foil that is placed a short distance—e.g., few millimeters—from the first foil, and strips electrons from the remaining portion of the beam's cross section. Now, the charged stripped ions from this remaining portion of the beam flip their orbit, are thus extracted from the ion beam, and are directed towards the target. The two extracted portions of the ion beam irradiate the target at positions separated from each by a distance dependent upon the distance between the planes of the two foils. Such foils can be made of a thin graphite film (500 Angstroms, for example).

Figure 1A:
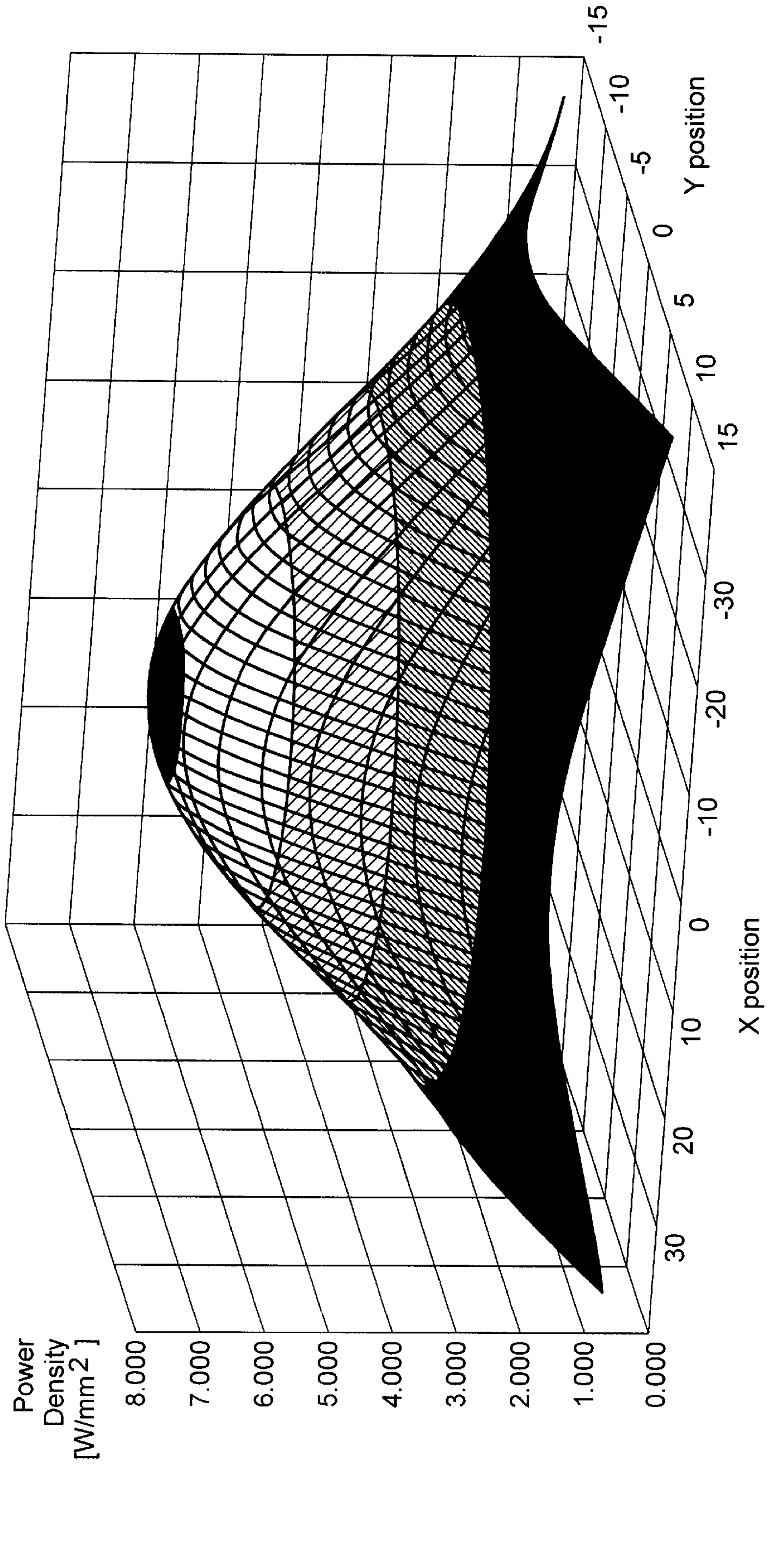
FIG. 1 (*a*) is a depiction of the intensity profile for a single beam.
Figure 1B:
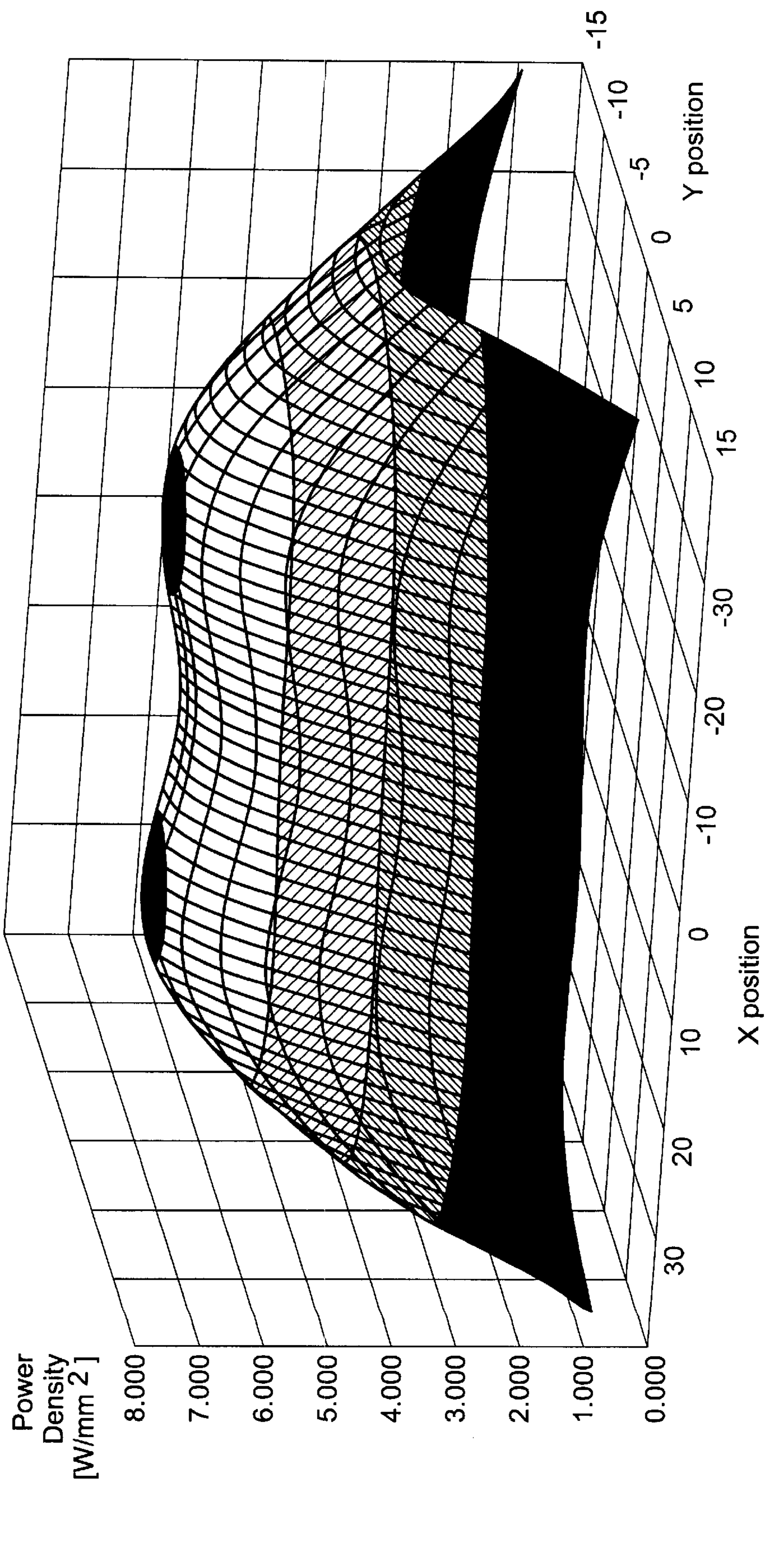
Figure 2A:
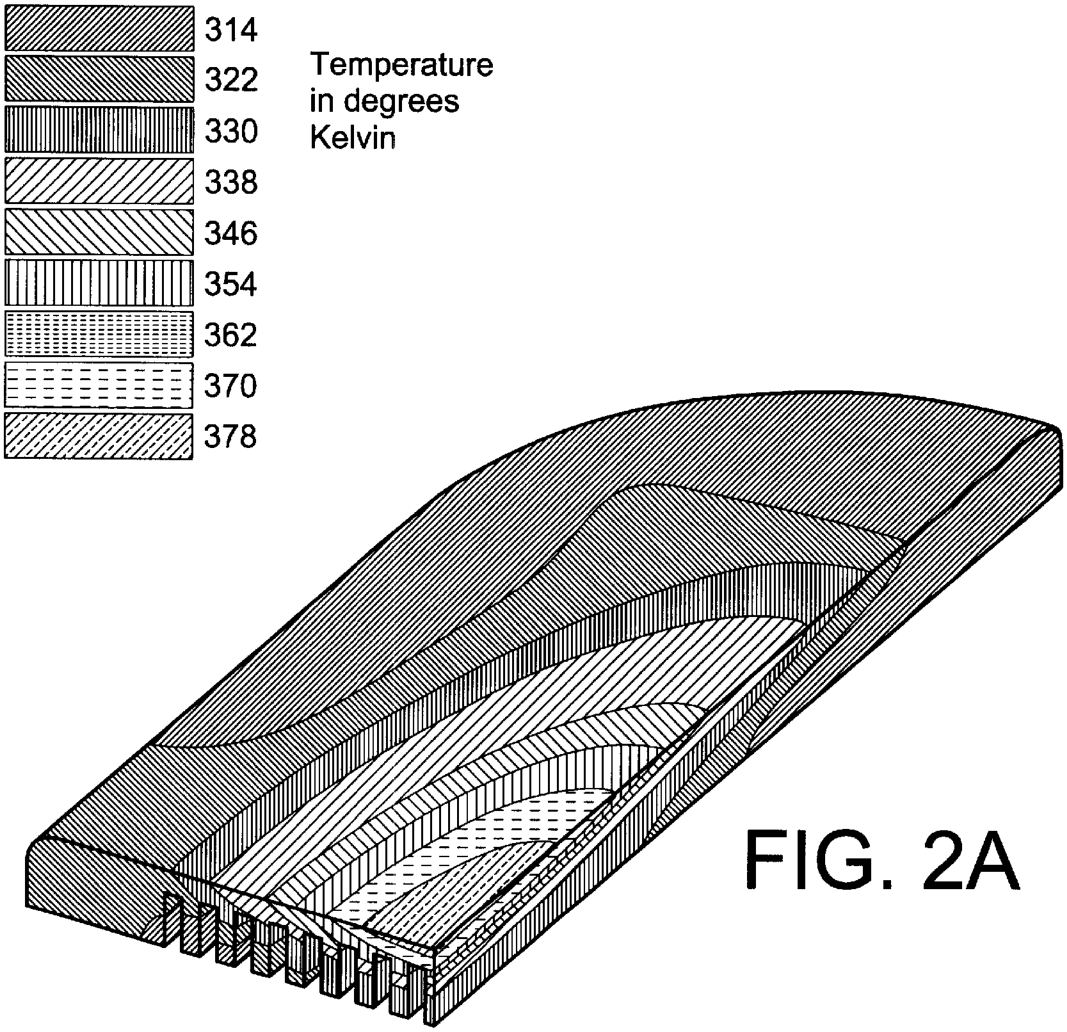
FIG. 2(*a*) is a modeling of the thermal distribution on a target irradiated by the ion beam of FIG. 1(*a*)
Figure 2B:
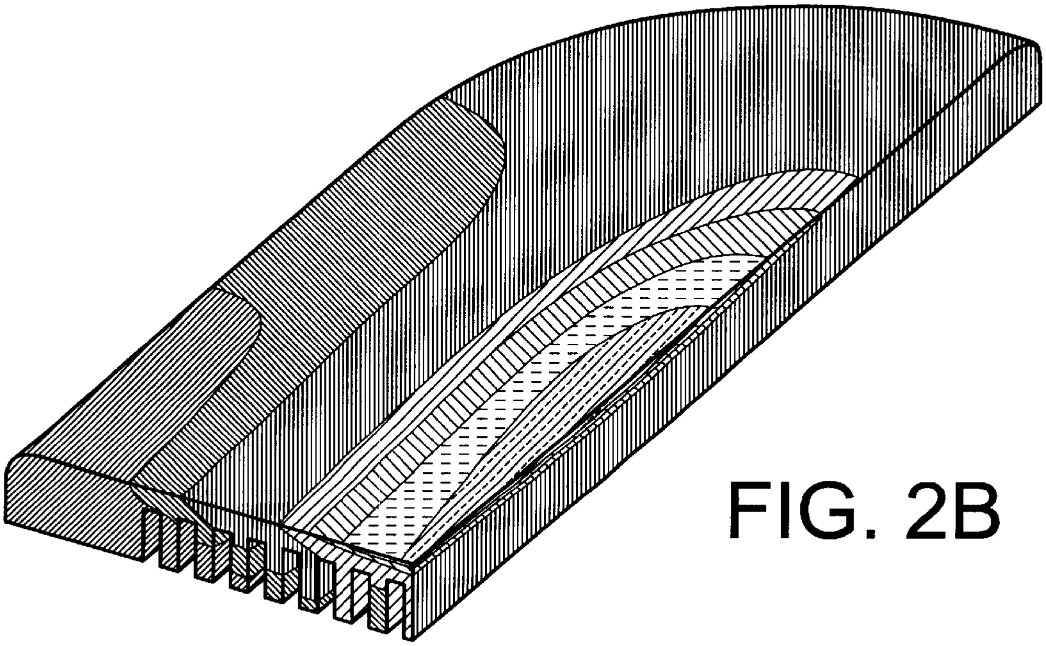

A benefit of a single ion beam being divided into two separate, but close, ion beams can be appreciated by reference to FIGS. 1 and 2. FIG. 1(*a*) shows the intensity profile of a single ion beam generated by a known technique, having a Gaussian profile, irradiated onto a target. In this example, an 8 kW beam is targeted centrally onto a 30-mm by 80-mm target. Targets of those dimensions are often used for isotope production. A peak energy density of the generated ion beam of 7.35 MW/m2 produces, on a well-cooled target, a temperature of about 104 C. This value is used just as a reference point but is, in fact, an upper limit for many target materials. More intense beams generate proportionally higher temperatures. The Gaussian beam is shown to be truncated to an 80% rectangular shape from an original ellipse.

FIG. 2(*a*) shows the thermal profile on a quadrant of the target surface. The thermal profile is obtained using Ansys 5.5.3 thermal modeling program to model the heating of the target by the single peak ion beam of FIG. 1(*a*). The modeling results have been experimentally verified with very high correlation between the modeling and the experiment.

FIG. 1(*b*) shows the intensity profile of dual ion beams generated by the present invention, having Gaussian profiles, irradiated onto a target identical to that used for irradiation by the ion beam having the profile in FIG. 1(*a*). The peaks of the intensity of the two ion beams are spaced approximately 40-mm apart. In this case, each beam delivers 5 kW; thus the dual ion beams deliver a total of 10 kW to the target. As before, the combined beam shape was trimmed to deposit 80% of beam power to the target. The highest beam intensity for the dual peak beam of FIG. 1(*b*) can be seen to be 7.2 MW/m2, which is slightly lower then the 7.35 MW/m2 in the case of the single peak beam of FIG. 1(*a*).

FIG. 2(*b*) shows the thermal profile on a quadrant of the target surface irradiated by the dual peak ion beam of FIG. 1(*b*). Considering the higher total power of 10 kW (compared to 8 kW) delivered by the dual peak beam of FIG.

1(*b*) onto the target, however, a maximum temperature of only 102 C. is obtained. This temperature for the target is comparable and actually less than the temperature of 104 C. for the identical target, resulting from the delivery of 8 kW power by the single peak ion beam of FIG. 1(*a*). Comparing FIG. 2(*a*) to FIG. 2(*b*) shows that the dual peak ion beams also results in a generally lower temperature distribution throughout the surface of the target. FIGS. 2(*a*) & (*b*), therefore, demonstrate the ability of the present invention to increase total power deposited onto a target (10 kW vs. 8 kW) without increasing (actually decreasing) the temperature of the target.

The exemplary embodiments of the inventive concept can be better appreciated with a brief review of the physics controlling the trajectory of a particle having mass m, a charge q, and moving at a speed v perpendicular to a magnetic field B. Under such a geometry, the trajectory of the particle is a circle with a radius of R given (in Gaussian units, where c is the speed of light) by:

$$R=(m*c*v)/(q*B) \quad \text{Equation (1).}$$

The center of the circle having radius R as calculated in Equation (1) is in the positive y hemisphere if:

(1) the velocity v is in the x direction;

(2) the charge q is positive; and (3) the magnetic field B is in the z direction.

A change in the sign of q, the direction of v, or the direction of B is accompanied by a respective flip in the position of the center of the beam's orbit. For example, if only the sign of q is changed because instead of a positive charge one has a negative charge, then the center of the circle is flipped into the lower y hemisphere. On the other hand, if v is in the negative x direction and the magnetic field is in the negative z direction, then the center of the circle is in the upper y hemisphere because the two flips place the center back to the upper y hemisphere.

Figure 3A:
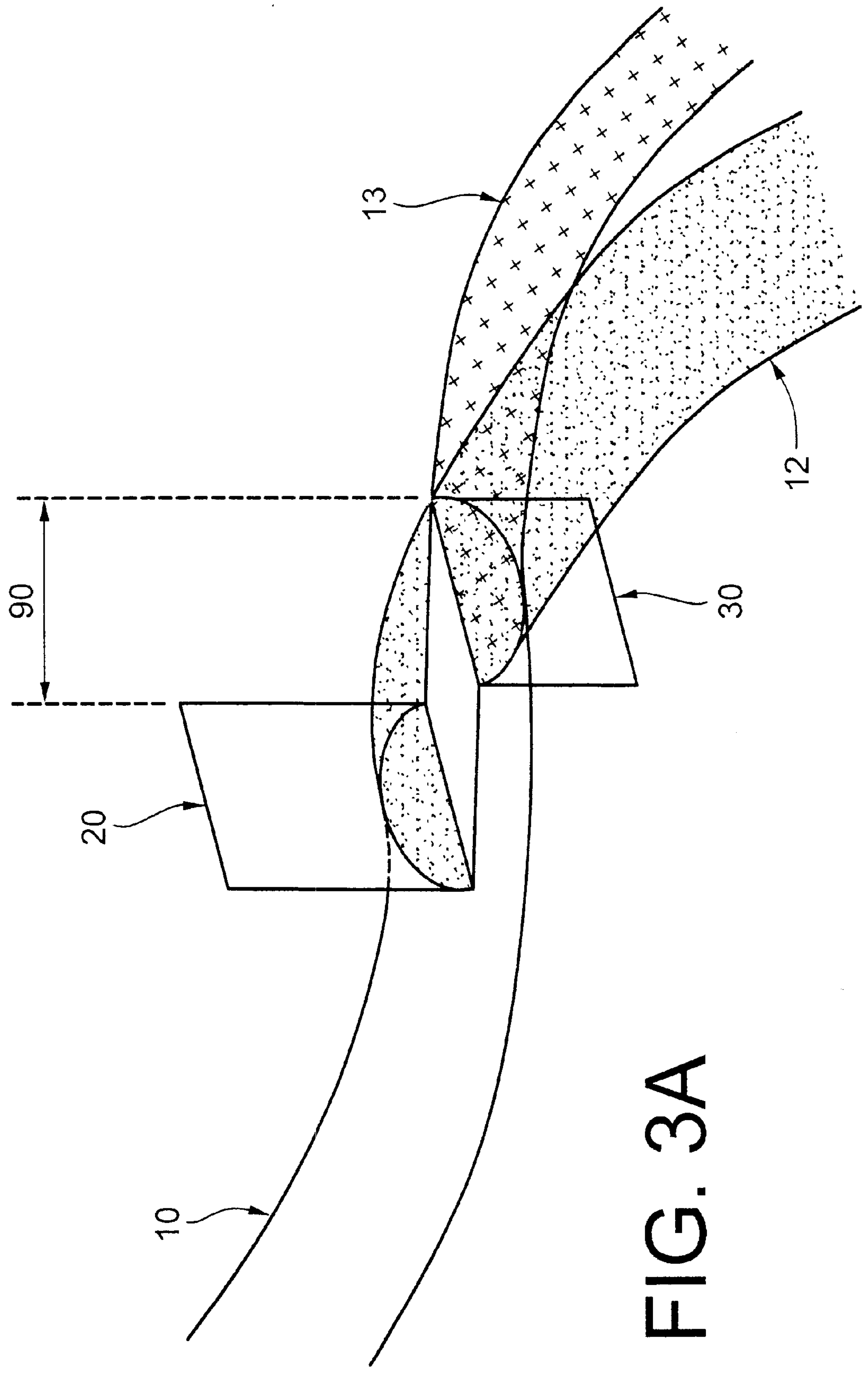
FIG. 3(*a*) is diagram illustrating a first exemplary embodiment of the invention using two extraction foils.
Figure 3B:
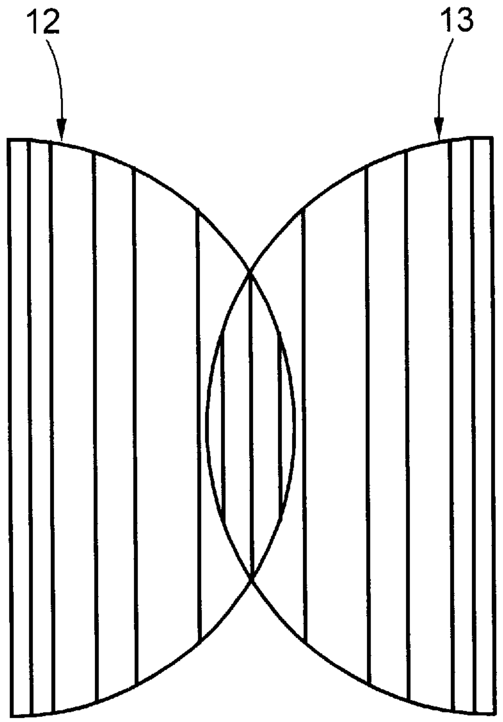
Figure 3C:
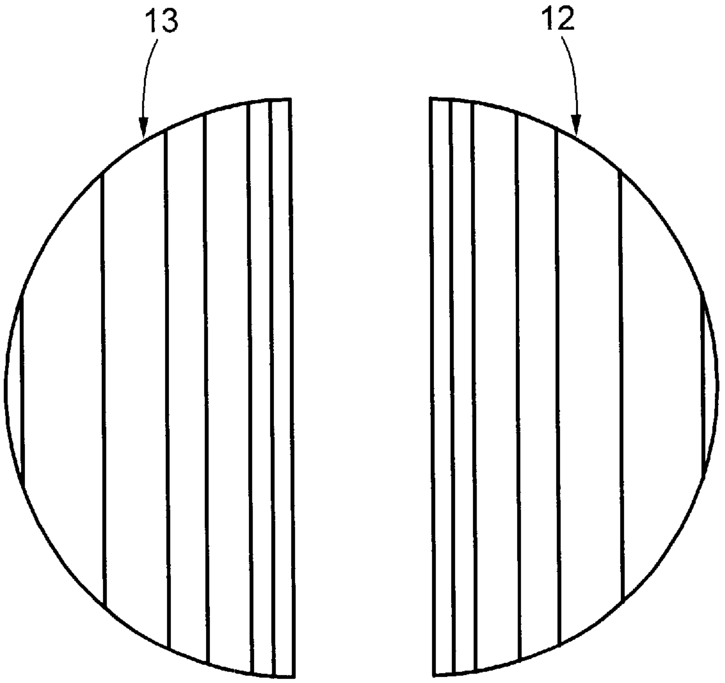

FIG. 3(*a*) is a diagram illustrating a first exemplary embodiment of the inventive concept. A negative ion beam 10 (composed of $H^-$ ions, for example, having an intensity profile described by a Gaussian profile) travels in the plane of the page in a counterclockwise direction. The beam 10 has a circular orbit with a center in the upper y hemisphere because of the presence of a magnetic field that is perpendicular to the page (not shown in FIG. 3(*a*) or in the subsequent figures showing the other exemplary embodiments of the present invention). Because of the accelerating geometry, the ions in the ion beam increase their kinetic energy as they travel downstream (however, the present invention can be practiced in arrangements in which the ion beam 10 is only orbitally accelerated by an applied magnetic field and is not linearly accelerated; the ion beam 10 in this case will have a constant orbital speed).

A foil 20 (e.g., made of a thin graphite film of 500 Angstroms that is electrically grounded) intercepts the upper half of the beam 10 and strips two electrons from nearly every H_ ion in the upper half of the beam thus converting the ions to $H^+$. The foil 20, therefore, changes the sign and the magnitude of the charge of the ions that form the upper half of the beam 10. The upper half of the beam 10, after passing through foil 20, therefore flips its center from the upper y hemisphere into the lower y hemisphere. Moreover, the upper half of the beam 10, after going through foil 20, therefore has an orbit radius that is twice the orbit radius just before the beam 10 encounters the foil 20. The ions in the upper half of the beam 10 are, thus, extracted as beamlet 12.

A second foil 30 (e.g., made of a thin graphite film of 500 Angstroms that is electrically grounded) then intercepts the lower half of the beam 10 and strips two electrons from nearly every $H^-$ ion in the lower half of the beam thus converting the ions to $H^+$. The foil 30, therefore, changes the sign and the magnitude of the charge of the ions that form the lower half of the beam 10. The lower half of the beam 10, after passing through foil 30, therefore flips its center from the upper y hemisphere into the lower y hemisphere. Moreover, the lower half of the beam 10, after passing through foil 30, therefore has an orbit radius that is twice the orbit radius just before the beam 10 encounters the foil 30. The ions in the lower half of beam 10 are thus extracted as beamet 13.

In FIG. 3(*a*), the orbital distance 90 (distance along the orbital path of the beam 10) separates the planes of foils 20 and 30. The distance 90 between planes of the foils 20 and 30 is preferably a small fraction of the radius of curvature of the beam's cyclotron orbit. The respective planes of the foils 20 and 30 are perpendicular to the page. In FIG. 3(*a*), however, the foils 20 and 30 are shown tilted for the sake of clarity. In FIG. 3(*a*) (as well as in FIGS. 4–6), moreover, the diverging extraction of the beamlets 12 and 13 is exaggerated for the sake of clarity.

The profile of the irradiation (the combination of beamlets 12 and 13) on the target is dependent upon the distance 90 between the foil 20 and the foil 30. FIG. 3(*b*) shows a top-hat like intensity profile for the irradiation on the target. Rather than the actual intensity profile of a beamlet, for the sake of simplicity the beamlet profiles in this and subsequent figures are shown as portions of a circle—of course the actual beamlet profiles will be related to the Gaussian profile and will vary across the beam profile in two dimensions. The profile depicted in FIG. 3(*b*) results because foil 20 is upstream from foil 30. The beamlet 12 is directed to the target with a radius of curvature that is smaller than that for the beamlet 13 because the ions of beamlet 12 are extracted upstream from the ions of beamlet 13 and, therefore, generally have a lower speed when extracted. According to equation (1), the difference between the radii of curvature of beamlets 12 and 13 is proportional to the difference in the speeds of ions at their extraction points.

The difference between the radii of curvature of beamlets 12 and 13, as well as the distance between the foils 20 and 30 (distance 90), lead to a departure from perfect parallelism between beamlets 12 and 13. Careful manipulation of the parameters forming Equation (1), however, allows a user to obtain very nearly parallel beamlets. For example, using a typical cyclotron radius of 2 meters along with constant speed ion beams and 2 mm for the orbital distance between foils 20 and 30 (resulting in a foil separation of 1/1000 of the radius of a cyclotron orbit) results in an angle between the beamlets that is very small (1/1000 radians in this case). However, it is to be noted that the present invention is not limited to generating nearly parallel beamlets. Indeed, the present invention can be practiced to control the angle of divergence between generated beamlets in addition to shaping the intensity profile of the beamlets.

On the target's surface, the separation between the beamlets 12 and 13 controllably depends on the difference between the radii of curvature of beamlets 12 and 13 and the distance 90. In addition to the distance 90, various other parameters can be used to control the separation between beamlets 12 and 13 at the target surface. These parameters include, but are not limited to, the magnetic field, residual charge on the ion after stripping, speed of ions in the orbit at extraction point, mass of the ion, and the distances between the points of extraction and the target.

The inventive concept as embodied in FIG. 3(*a*) can be implemented in a configuration where the foil 30 is upstream from the foil 20. FIG. 3(*c*) shows an irradiation profile on a target resulting from placing foil 30 upstream from foil 20. In this configuration, beamlet 13 is extracted first; it has a smaller radius of curvature than beamlet 12; and therefore, beamlets 13 and 12 in the profile shown in FIG. 3(*c*) have their positions switched from that shown in FIG. 3(*b*). As explained by way of the first exemplary embodiment, the order of the foils is a parameter that a user can manipulate to control the shaping and division of an ion beam into plural beamlets.

In embodiments implementing the inventive concept, the foils can be placed on separate micro-positioners that allow the separate positioning and tilting of the foils. Alternatively, the foils can be placed on the same holder thus fixing their positioning. Tilting a foil that extracts a portion of the beam 10 results in some ions (those being intercepted by the part of the foil tilted upstream) being extracted earlier than other ions (those being intercepted by the part of the foil tilted downstream) and, thus, results in expanding the extracted beamlet. Tilting a foil, therefore, can be used as a parameter (in addition to the orbital distance between foils) to further redistribute intensity or shape beam profile. Tilting can be applied to more than one of the plurality of foils at any one time; for example, to shape the intensity profile of a beam that has a decentered intensity peak or that has anisotropic beam-width.

The present invention can be practiced using foils that intercept the ion beam with different areas resulting in beamlets having identical or different intensity profiles.

Figure 4:
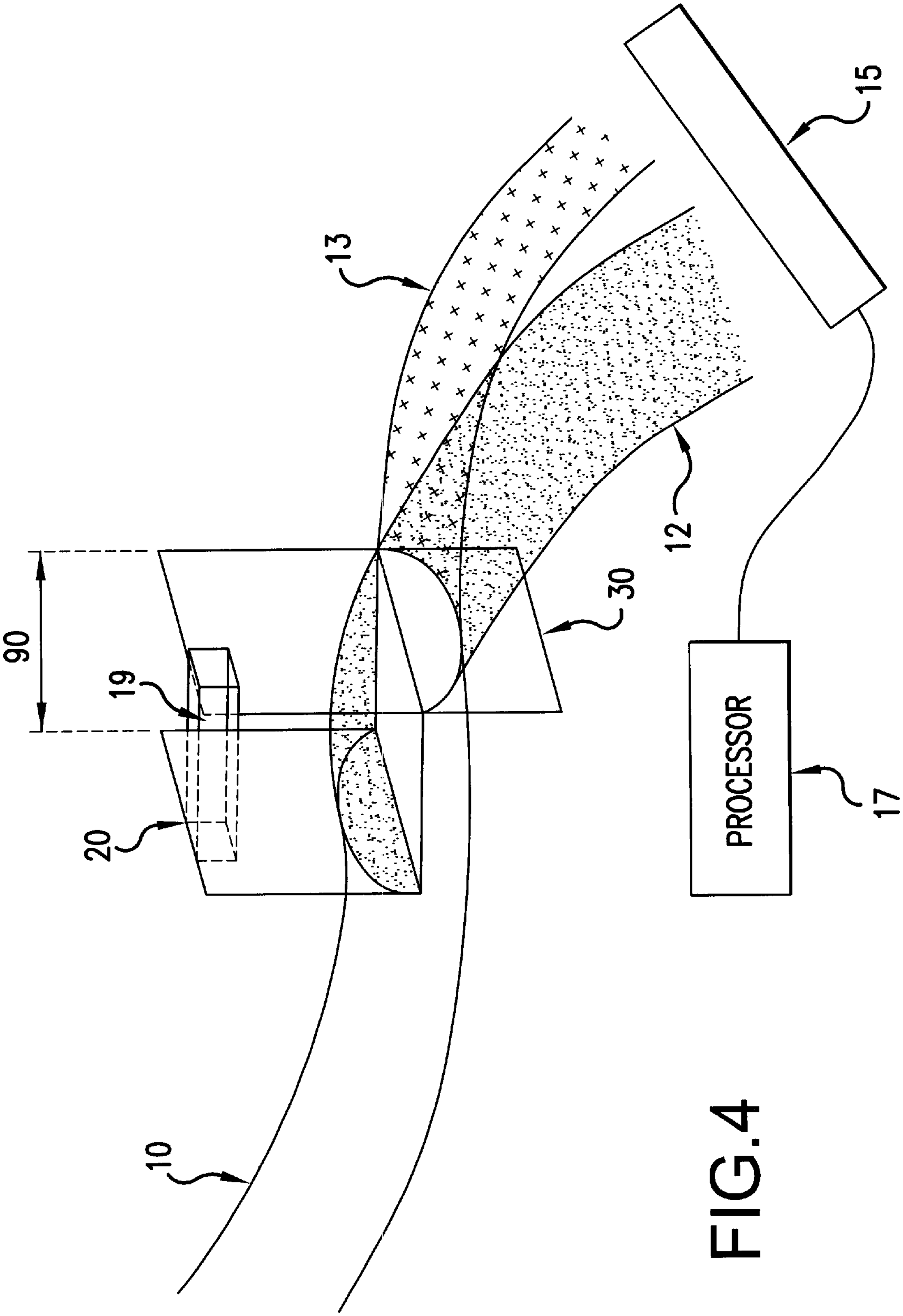
FIG. 4 is a diagram illustrating a second exemplary embodiment of the invention using two extraction foils.

Instead of using plural foils that only intercept portions of the beam 10, as in the exemplary embodiment of FIG. 3(*a*), the invention can be practiced using plural foils where at least one foil intercepts a portion of the beam 10 and where one foil intercepts all of the beam 10 (this full beam intercepting foil is the last foil downstream). Such an implementation is shown in FIG. 4, which illustrates a second exemplary embodiment of the inventive concept. The distance 90, along a beam's path, between the planes of the successive foils, is preferably a small fraction of the radius of curvature of the beam's cyclotron orbit.

As in the first exemplary embodiment, the second exemplary embodiment uses two foils (a first foil 20 intercepting the upper half of the beam 10 and a second foil 30) to extract the ion beam 10. As in the first embodiment, furthermore, the top foil 20 in the second embodiment is upstream from the bottom foil 30. As in the first embodiment, moreover, the foil 20 in the second embodiment intercepts the upper half of the beam 10 and extracts beamlet 12. Unlike the first embodiment, however, the foil 30 intercepts the remaining portion of beam 10 and beamlet 12 in extracting the beamlet 13 from the remaining portion of beam 10. The interception of beamlet 12 by foil 30 does not affect beamlet 12 because beamlet 12 is already stripped of electrons.

The second exemplary embodiment, as shown in FIG. 4, can be implemented with plural foils partially intercepting the beam 10 and extracting beamlets, as explained with respect to the exemplary embodiments described below, with the foil that fully intercepts the beam 10 being downstream from all of the foils that partially intercept the beam.

Implementing the inventive concept as in the second exemplary embodiment simplifies the manipulation of the foils to change the reshaping of the intensity profile of ion beam 10. For example, to change the reshaping of beam 10, a user need not change the position of the foil 30—changing the position of the foil 20 and the tilting of the foils 20 and 30 is sufficient. It is to be noted that the incremental beam intercepting area of the last foil (beyond the total beam intercepting areas of the upstream foils) is the relevant area as far as charge stripping and, thus, intensity profile shaping is concerned. Therefore, the second embodiment simplifies the practice of the invention (in all its embodiments) by allowing the easy mechanical manipulation of a single large area foil to shape the intensity within thin areas of the beam 10 instead of using narrow foils, which are harder to manufacture and manipulate.

Figure 5A:
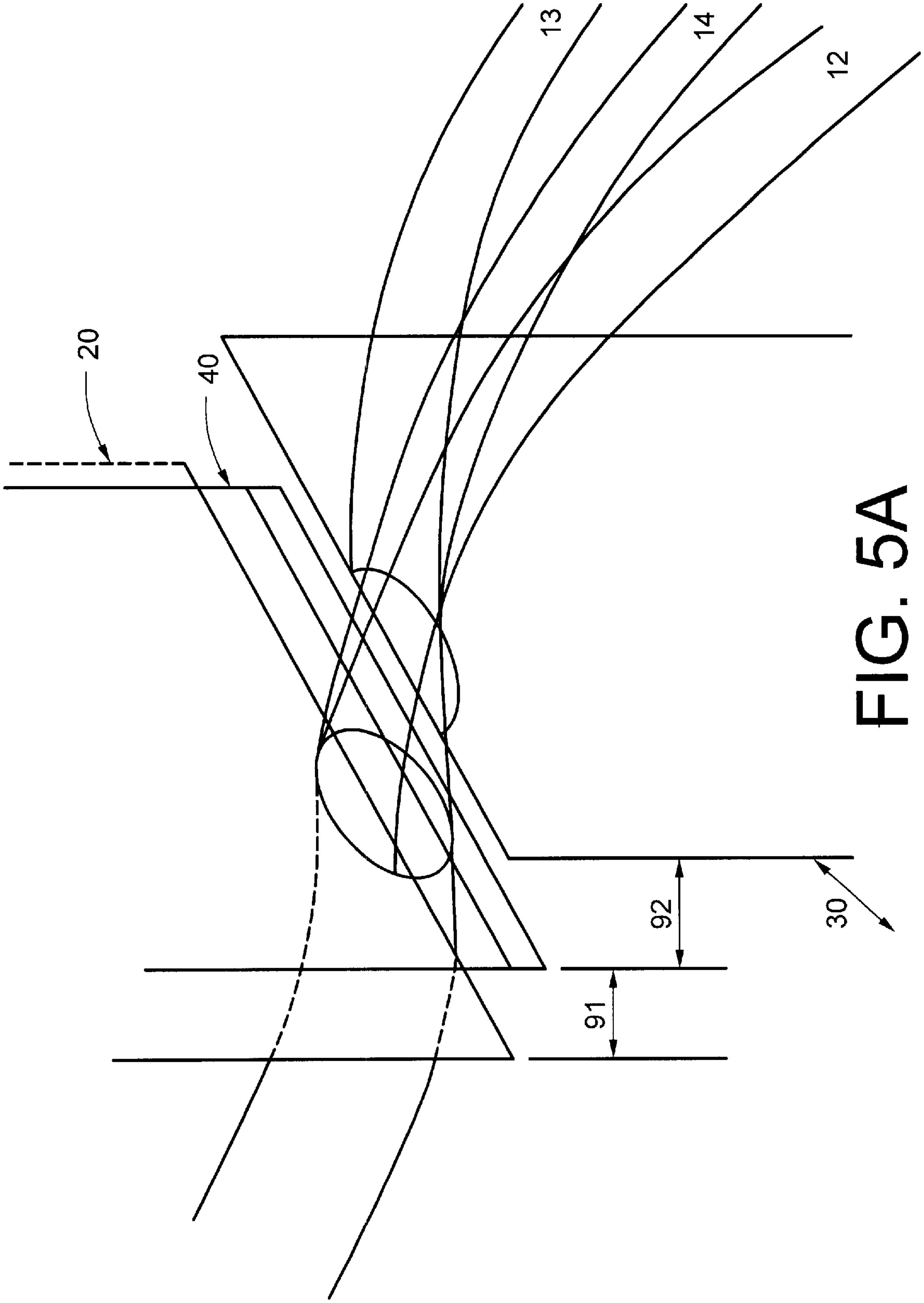
FIG. 5(*a*) is a diagram illustrating a third exemplary embodiment of the invention using three extraction foils.
Figure 5B:
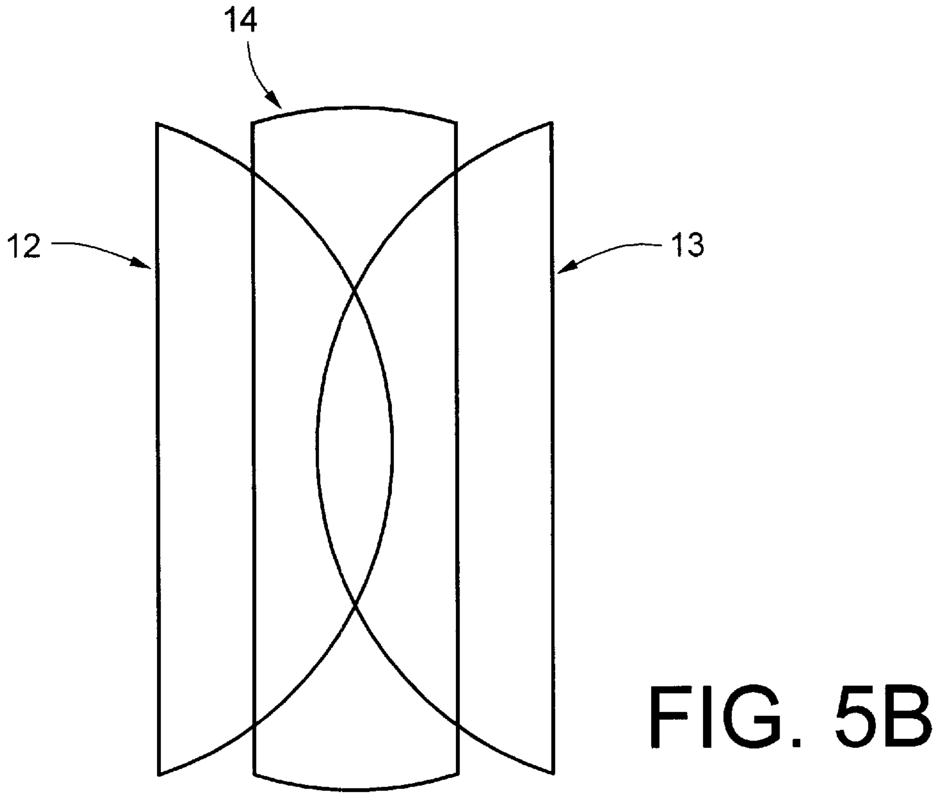
Figure 5C:
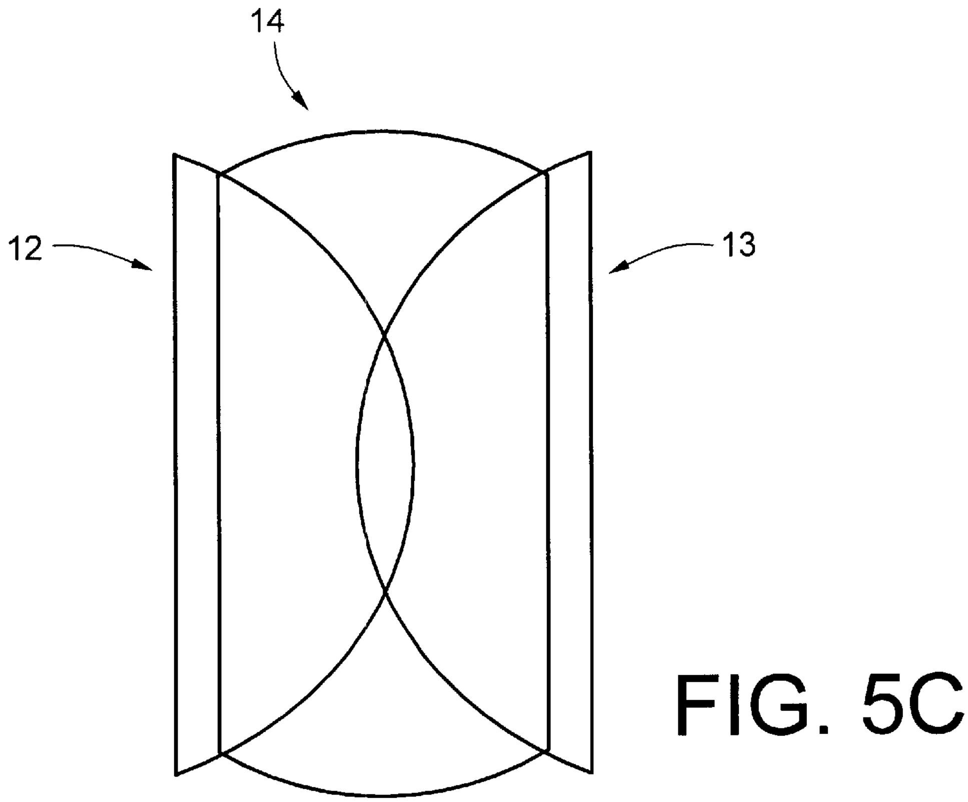

FIG. 5(*a*) is a diagram illustrating a third exemplary embodiment of the inventive concept. In the third embodiment, three foils (top foil 20, bottom foil 30, and middle foil 40) are used, instead of two foils, to extract the beam 10 and direct it onto a target. The top foil 20 and the bottom foil 30 intercept equal portions of the beam 10, with each intercepting a portion larger than the portion intercepted by the middle foil 40. In this embodiment, the top foil is placed upstream from the other two foils. The top foil 20 extracts a beamlet 12 from the beam 10. Next in the stream is the middle foil 40 and is placed an orbital distance 91 from the top foil 20. The middle foil 40 extracts a beamlet 14 from the remaining portion of beam 10. Last in the stream is the bottom foil 30, which is placed an orbital distance 92 from the middle foil 40. The bottom foil 30 extracts beamlet 13, which is the remaining portion of beam 10. The distance, along a beam's path, between the planes of successive foils is preferably a small fraction of the radius of curvature of the beam's cyclotron orbit. In an implementation of the inventive concept, the foils are placed on micro-positioners 19 that allow the separate positioning and tilting of the foils.

FIG. 5(*b*) shows a top-hat like profile for the intensity of irradiation on the target resulting from the extraction of beamlets 12, 13, and 14. The top-hat profile of FIG. 5(*b*) should be a more uniform reshaping of the intensity of beam 10 than the top-hat profile of FIG. 3(*b*). The profile shown in FIG. 5(*b*) results because top foil 20 is upstream from the other two foils 30 and 40. The beamlet 12 is directed to the target with a radius of curvature that is smaller than that for the other two beamlets 13 and 14. By similar reasoning, the radius of curvature of the beamlet 14 is smaller than that for the beamlet 13. According to equation (1), the difference between the radii of curvature of beamlets 12, 13, and 14 is proportional to the difference in the speeds of ions at their extraction points.

The difference between the radii of curvature of beamlets 12, 13, and 14, as well as the distance between the planes of the foils 20, 30, and 40 (distances 91 and 92), lead to a departure from perfect parallelism between beamlets 12, 13, and 14. On the target surface, the separations between the beamlets 12, 13, and 14 controllably depend on the difference between the radii of curvature of beamlets 12, 13, and 14 and the distances 91 and 92. In addition to the distances 91 and 92, various other parameters can be used to control the separation between beamlets 12, 13, and 14 at the target surface. These parameters include, but are not limited to, the magnetic field, residual charge on the ion after stripping, speed of ions in the orbit at extraction point, mass of the ion, and the distances between the points of extraction and the target.

In an implementation of the inventive concept, the foils are placed on micro-positioners that allow the separate positioning and tilting of the foils 20, 30, and 40. Tilting a foil that extracts a portion of the beam 10 results in some ions (those being intercepted by the part of the foil tilted upstream) being extracted earlier than other ions (those being intercepted by the part of the foil tilted downstream) and, thus, results in expanding the extracted beamlet. An implementation of this embodiment has the middle foil 40 tilted so that the beamlet 14 is expanded to overlap greater portions of beamlets 12 and 13 and, thus, further make uniform the resulting intensity profile on the target's surface. FIG. 5(*c*) is a diagram showing the intensity profile resulting from tilting the middle foil 40 and thus expanding beamlet 14.

As explained by way of the first exemplary embodiment, the order of the foils is a parameter that a user can manipulate to control the shaping and division of an ion beam into plural beamlets.

Figure 6A:
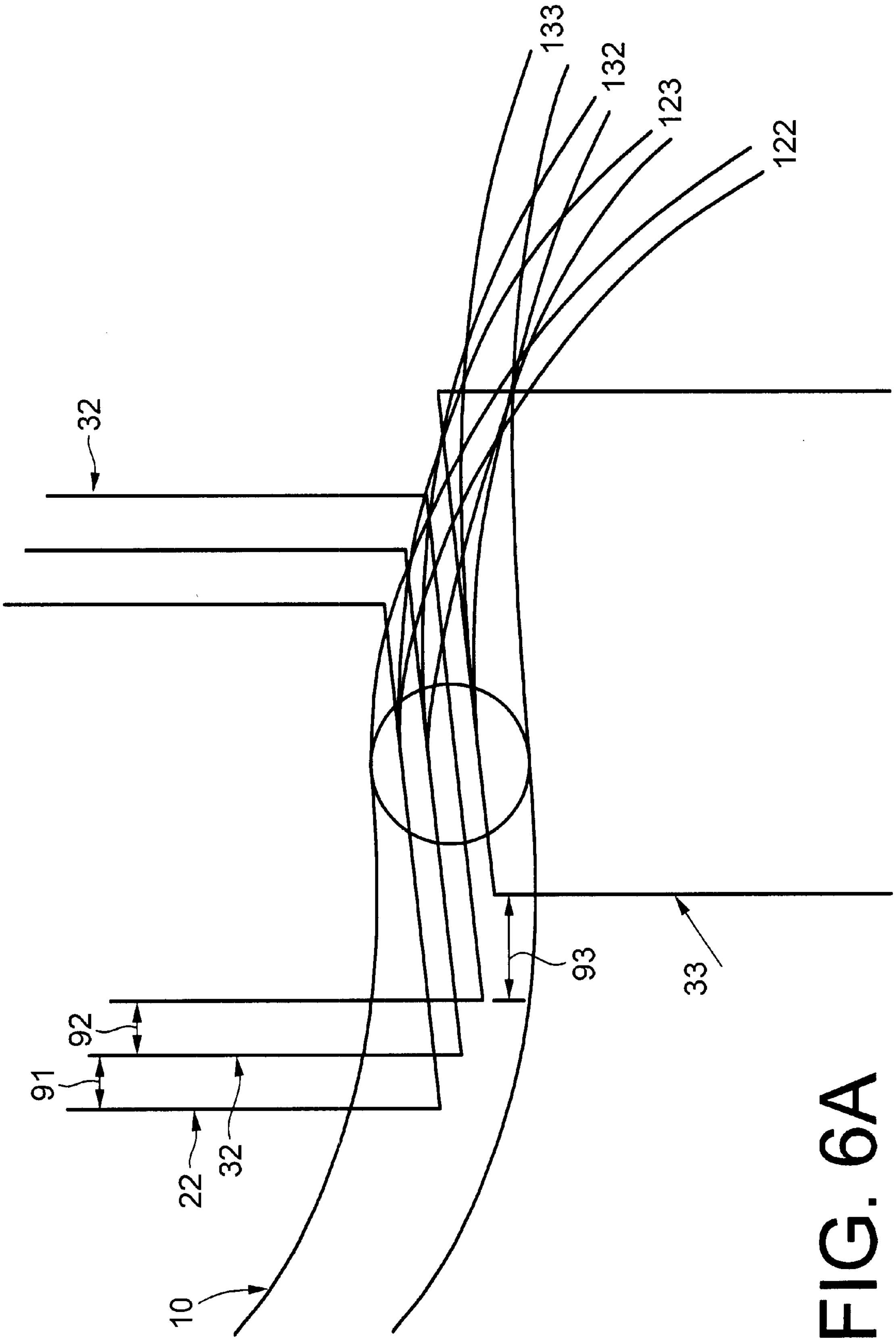
FIG. 6(*a*) is a diagram illustrating a fourth exemplary embodiment of the invention using four extraction foils.
Figure 6B:
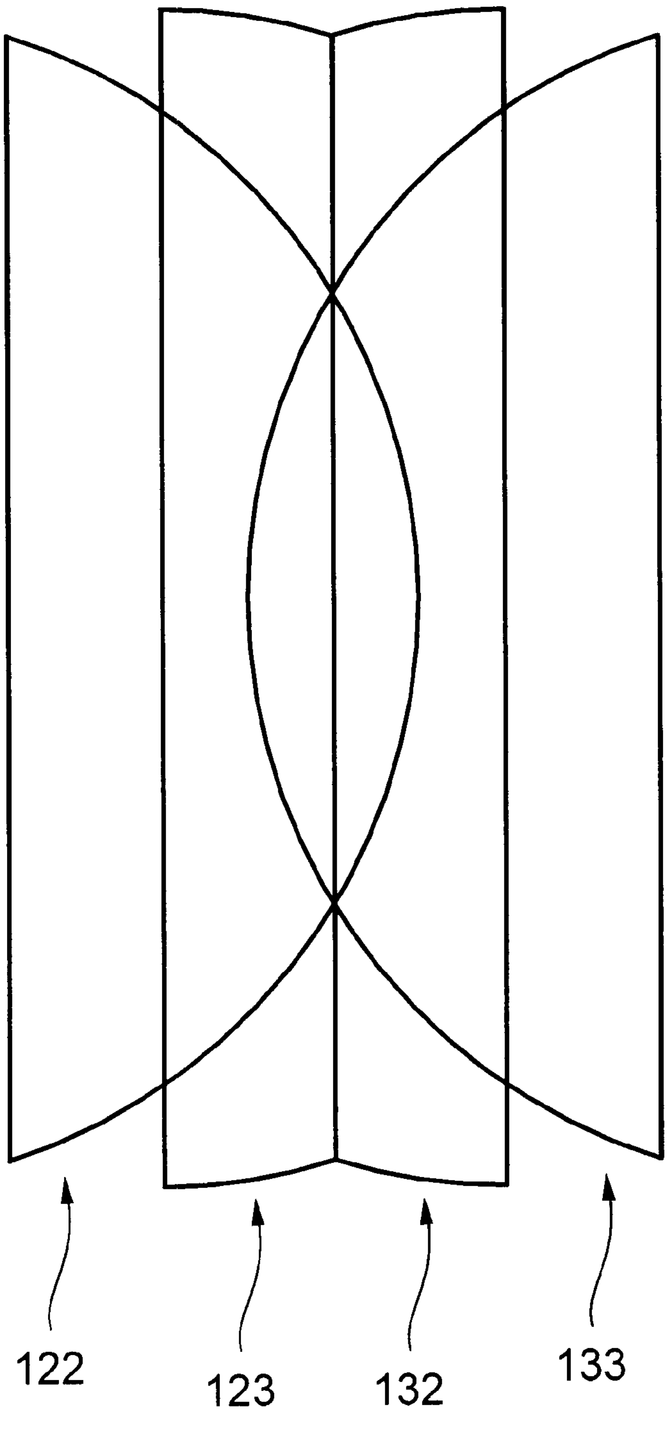

FIG. 6(*a*) is a diagram illustrating a fourth exemplary embodiment of the inventive concept. In the fourth embodiment, four foils (upper-top foil 22, lower-top foil 23, upper-bottom foil 32, and lower-bottom foil 33) are used to extract the beam 10 and direct it onto a target. The upper-top foil 22 and the lower-bottom foil 33 intercept equal portions of the beam 10, with each intercepting a portion larger than the portion intercepted by each of the lower-top foil 23 and upper-bottom foil 32, which themselves intercept equal portions. In this embodiment, the upper-top foil 22 is placed upstream from the other three foils and it extracts a beamlet 122 from the beam 10. Next in the stream is the lower-top foil 23, it is placed an orbital distance 91 from the upper-top foil 22, and it extracts a beamlet 123 from the remaining portion of beam 10. Next in the stream is the upper-bottom foil 32, it is placed an orbital distance 92 from the lower-top foil 23, and it extracts beamlet 132 from the remaining portion of beam 10. Last in the stream is lower-bottom foil 33, it is placed an orbital distance 93 from the upper-bottom foil 32, and it extracts beamlet 133, which is the remaining portion of beam 10. The distance, along a beam's path, between the planes of successive foils is preferably a small fraction of the radius of curvature of the beam's cyclotron orbit. In an implementation of the inventive concept, the foils are placed on micro-positioners that allow the separate positioning and tilting of the foils.

FIG. 6(*b*) shows a top-hat like profile for the intensity of irradiation on the target resulting from the extraction of beamlets 122, 123, 132, and 133. The top-hat profile of FIG. 6(*b*) should be an even more uniform reshaping of the intensity profile of beam 10 than the top-hat profiles of FIGS. 3(*b*) and 5(*b*). The profile shown in FIG. 5(*b*) results because upper-top foil 22 is upstream from the other foils 23, 32, and 33. The beamlet 122 is directed to the target with a radius of curvature that is smaller than that for the other beamlets 123, 132, and 133. By similar reasoning, the radius of curvature of beamlet 123 is smaller than that for the other beamlets 132 and 133. And similarly, the radius of curvature of beamlet 132 is smaller than that for beamlet 133. According to equation (1), the difference between the radii of curvature of beamlets 122, 123, 132, and 133 is proportional to the difference in the speeds of ions at their extraction points.

The difference between the radii of curvature of beamlets 122, 123, 132, and 133, as well as the distance between the planes of the foils 22, 23, 32, and 34 (distances 91, 92, and 93), lead to a departure from perfect parallelism between beamlets 122, 123, 132, and 133. On the target's surface, the separations between the beamlets 122, 123, 132, and 133 controllably depend on the difference between their radii of curvature and the distances between them. Additionally, various other parameters can be used to control the separation between beamlets 122, 123, 132, and 133 at the target's surface. These parameters include, but are not limited to, the magnetic field, residual charge on the ion after stripping, speed of ions in the orbit at extraction point, mass of the ion, and the distances between the points of extraction and the target.

In an implementation of the inventive concept, the foils are placed on micro-positioners that allow the separate positioning and tilting of the foils 22, 23, 32, and 33. Tilting a foil that extracts a portion of the beam 10 results in some ions (those being intercepted by the part of the foil tilted upstream) being extracted earlier than other ions (those being intercepted by the part of the foil tilted downstream) and, thus, results in expanding the extracted beamlet. An implementation of this embodiment has the foils 23 and 32 tilted so that the beamlets 123 and 132 are expanded to overlap beamlets 122 and 133 and, thus, further make uniform the resulting intensity profile on the target's surface.

As explained by way of the first exemplary embodiment, the order of the foils is a parameter that a user can manipulate to control the shaping and division of an ion beam into plural beamlets.

In light of the principles of the present invention disclosed herein, more than four foils can be used to shape the intensity profile of a beam or to btain various beamlets from a beam.

Shown in FIG. 4 is an implementation of the present invention in which imaging device(s) 15 that image(s) the intensity profile of ion beams can be used along with processor(s) 17 and display devices (not shown) to allow a user to interactively shape the intensity profile according to any of the exemplary embodiments described above. For example, imaging device(s) 15 obtain(s) the intensity (e.g., by observing a target's surface) and the processor(s) 17 compare(s) the obtained data with a specified profile specified by the user. In this case, if the difference between the imaged profile and the desired profile exceed threshold(s) set by the user then the processor(s) 17 can change parameter(s) (including, but not limited to, orbital distance between foils, the area of the ion beam foil(s) intercept, the tilt angle(s) of foil(s)-plane(s) with respect to the orbital path of the ion beam, the distance between foil(s) and the target, etc.) to bring the difference within the threshold(s). Such an approach can be further automated using optimization to obtain specified overall beamlet distribution by varying the parameters subject to specified constraints.

Although the present invention has been described with respect to a single ion beam 10, the inventive concept of closely placing plural foils to shape the intensity profile of an ion beam going through a foil can be applied to plural ion beams going through a single foil at a time. Moreover, although the invention has been described as irradiating a target by the extracted shaped beam 10 (extracted plural beamlets), the plural generated beamlets can be incident on other intervening equipment including. Magnetic lenses can be used, for example, to further shape or redirect the beamlets generated by the present invention before they are incident on a target. Beamlets generated according to the present invention can also be used as seeds in subsequent accelerating stages. Furthermore, the present invention can be used to generate very nearly parallel beamlets for use in applications requiring such beamlets.

The invention herein disclosed is not limited to negatively charged hydrogen ion beams. Instead, the present invention can be used on other elemental or molecular ions including, but not limited to, other isotopes of hydrogen, helium, etc.

The exemplary embodiments of the present invention were described using graphite as the preferred material forming the charge stripping foil. However, instead of graphite, other material can be used as the foil material including, but not limited to, metals such as tungsten or niobium, or insulators such as ceramics that become electrically conducting when heated. Moreover, fluids instead of solids can be used as the charge stripping foil; for example, a liquid or gaseous jet can be used as the foil. Moreover, although in the exemplary embodiments of the present invention 500 angstroms was used as an example for the thickness of the charge stripping foils, many applications implement a single graphite foil having a thickness in the range of 100 angstroms to 5 microns. Keeping in mind that thinning a foil's thickness causes mechanical support problems and thickening a foils thickness reduces ion beam transmission, the invention can be practiced using a specific foil thickness depending on the foil's absorption coefficient of the ion beam and its tensile strength.

The plural foils implemented in practicing the present invention can have straight line or curvilinear edges depending on the initial intensity profile of the ion beam and the desired intensity profile of the shaped ion beam. Furthermore, although the exemplary embodiments describing the present invention were addressed to shaping an initial Gaussian intensity profile of an ion beam into a top-hat like intensity profile, instead the present invention can be practiced to shape an initial intensity profile of an ion beam into any other specific intensity profile. Moreover, although the figures describing the exemplary embodiments of the present invention show plural foils having parallel straight line edges, instead the present invention can be practiced using plural foils having non-parallel edges-both straight line and curvilinear-depending on the initial intensity profile of the ion beam and the desired intensity profile of the shaped ion beam. Furthermore, although in the exemplary embodiments describing the present invention some of the foils intercepted equal portions of the ion beam, instead the present invention can be practiced using plural foils intercepting non-equal portions of the ion beam depending on the initial intensity profile of the ion beam and the desired intensity profile of the shaped ion beam.

Plural beamlets extracted by the present invention have identifying characteristics including intensity profiles with asymmetrically (e.g., skewed) decaying wings. This identifying characteristic, among other features, helps in practicing this invention to make uniform the intensity profile of an ion beam by rearranging different portions of the ion beam. Plural beamlets extracted by the present invention, moreover, can be produced to have identical intensity profiles and be separated by controllable distances at a target. Such beamlets can be produced to have identical features their points of generation are practically coalesced into a single point (when comparing with the orbital radius of the ion beam) and their extracting foils can be designed to have identical ion beam intercepting cross section. The separation of such beamlets when incident onto a target can be controlled by varying the parameters that produce beamlets (as described above) and allow the generation of controllably separated beamlets. The present invention, therefore, allows the division of a single beam into identical beamlets (or specified different beamlets) for use in irradiating plural targets spaced near each other. The present invention, therefore, allows the parallel processing of closely placed targets by ion beams that are finely shaped and controlled by an inexpensive and simple approach. The principles described herein can also be used to produce plural beamlets meeting a user's differing specified beamlet intensity profiles and divergence angles between the beamlets to address users' different but concurrent applications.

Although the present invention has been described in considerable detail with reference to certain exemplary embodiments, it should be apparent that various modifications and applications of the present invention may be realized without departing from the scope and spirit of the invention. Scope of the invention is meant to be limited only by the claims presented herein.

What is claimed is:

1. A method for shaping an ion beam having a velocity component perpendicular to a magnetic field, the ion beam having an orbital path with a radius of curvature, said method comprising:

placing a first foil in the path of the ion beam, said first foil partially intercepting the ion beam and producing a first beamlet; and placing a second foil in the path of the ion beam, said second foil intercepting the ion beam and producing a second beamlet, said second foil being placed at a first distance from said first foil, said first distance being a fraction of the radius of the orbital path.

2. The method according to claim 1, wherein said placing a second foil includes predetermining said first distance so that said first beamlet and said second beamlet are inclined with respect to each other at some angle.

3. The method according to claim 2, wherein said angle is zero.

4. The method according to claim 1, wherein said placing a second foil includes predetermining said first distance so that the intensity profiles of said first beamlet and said second beamlet combine to form a top-hat like intensity profile.

5. The method according to claim 1, wherein said placing a second foil results in said second foil fully intercepting the ion beam.

6. The method according to claim 1, wherein said placing a second foil results in said second foil partially intercepting the ion beam.

7. The method according to claim 6, further comprising:

placing a third foil in the path of the ion beam, said third foil intercepting the ion beam and producing a third beamlet, said third foil being placed at a second orbital distance from said second foil, said second distance being a fraction of the radius of the orbital path.

8. The method according to claim 7, wherein said placing a third foil includes predetermining said first distance and said second distance so that said first beamlet is inclined with respect to said second beamlet at some first angle, and said second beamlet is inclined with respect to said third beamlet at some second angle.

9. The method according to claim 8, wherein said first angle and/or the said second angle is zero.

10. The method according to claim 7, wherein said placing a third foil includes predetermining said first distance and said second distance so that the intensity profiles of said first beamlet, said second beamlet, and said third beamlet combine to form a top-hat like intensity profile.

11. The method according to claim 10, wherein said placing a third foil includes tilting said third foil, which tilting produces said third beamlet in expanded form and, thus, further makes uniform the formed top-hat like intensity profile.

12. The method according to claim 7, further comprising:

placing a fourth foil in the path of the ion beam, said fourth foil intercepting the ion beam and producing a fourth beamlet, said fourth foil being placed at a third orbital distance from said third foil, said third distance being a fraction of the radius of the orbital path.

13. The method according to claim 12, wherein each of said first distance, said second distance, and said third distance is a small fraction of the radius of the orbital path.

14. The method according to claim 12, wherein at least one of said first distance, said second distance, and said third distance is equal to or less than 2 millimeters.

15. The method according to claim 14, wherein each one of said first distance, said second distance, and said third distance is equal to or less than 2 millimeters.

16. Plural ion beamlets produced by the method of claim 1.

17. An apparatus for shaping an ion beam having a velocity component perpendicular to a magnetic field, the ion beam having an orbital path with a radius of curvature, said apparatus comprising:

a first foil partially intercepting the ion beam and producing a first beamlet; and a second foil intercepting the ion beam and producing a second beamlet, said second foil being placed at a first distance from said first foil, said first distance being a fraction of the radius of the orbital path.

18. The apparatus according to claim 17, further comprising a processor predetermining said first distance so that said first beamlet and said second beamlet are inclined with respect to each other at some angle.

19. The apparatus according to claim 18, wherein said angle is zero.

20. The apparatus according to claim 17, further comprising a processor predetermining said first distance so that the intensity profiles of said first beamlet and said second beamlet combine to form a top-hat like intensity profile.

21. The apparatus according to claim 17, wherein said second foil is arranged to fully intercept the ion beam.

22. The apparatus according to claim 17, wherein said second foil is arranged to partially intercept the ion beam.

23. The apparatus according to claim 22, further comprising:

a third foil intercepting the ion beam and producing a third beamlet, said third foil being placed at a second orbital distance from said second foil, said second distance being a fraction of the radius of the orbital path.

24. The apparatus according to claim 23, further comprising a processor predetermining said first distance and said second distance so that said first beamlet is inclined with respect to said second beamlet at some first angle, and said second beamlet is inclined with respect to said third beamlet at some second angle.

25. The apparatus according to claim 24, wherein said first angle and/or said second angle is zero.

26. The apparatus according to claim 22, further comprising a processor predetermining said first distance and said second distance so that the intensity profiles of said first beamlet, said second beamlet, and said third beamlet combine to form a top-hat like intensity profile.

27. The apparatus according to claim 26, further comprising a micro-positioner allowing the tilting of said third foil, which tilting produces said third beamlet in expanded form and, thus, further makes uniform the formed top-hat like intensity profile.

28. The apparatus according to claim 22, further comprising:

a fourth foil intercepting the ion beam and producing a fourth beamlet, said fourth foil being placed at a third orbital distance from said third foil, said third distance being a fraction of the radius of the orbital path.

29. The apparatus according to claim 28, wherein each of said first distance, said second distance, and said third distance is a small fraction of the radius of the orbital path.

30. The apparatus according to claim 28, wherein at least one of said first distance, said second distance, and said third distance is equal to or less than 2 millimeters.

31. The apparatus according to claim 30, wherein each of said first distance, said second distance, and said third distance is equal to or less than 2 millimeters.

* * * * *